United States Patent [19]

Eklund

[11] Patent Number: 5,146,298
[45] Date of Patent: Sep. 8, 1992

[54] DEVICE WHICH FUNCTIONS AS A LATERAL DOUBLE-DIFFUSED INSULATED GATE FIELD EFFECT TRANSISTOR OR AS A BIPOLAR TRANSISTOR

[76] Inventor: Klas H. Eklund, 103 Los Patios, Los Gatos, Calif. 95030

[21] Appl. No.: 747,657

[22] Filed: Aug. 16, 1991

[51] Int. Cl.⁵ .................... H01L 29/80; H01L 29/10; H01L 29/72; H01L 27/04
[52] U.S. Cl. .................................. 357/22; 357/23.4; 357/34; 357/48
[58] Field of Search ................ 357/22, 23.4, 34, 48

[56] References Cited

U.S. PATENT DOCUMENTS 4,626,879 12/1982 Colack .......................... 357/23.4
4,811,075 3/1989 Eklund .......................... 357/46

OTHER PUBLICATIONS

Sel Colak, "Effects of Drift Region Parameters on the Static Properties of Power LDMOS", IEEE Transactions on Electron Devices, vol. ED-28, No. 12, pp. 1455-1466 (Dec. 1981).
A. W. Ludikhulze, *High-Voltage DMOS and PMOS in Analog IC's*, IEDM, pp. 81-84 (1982).

Primary Examiner—Mark V. Prenty
Attorney, Agent, or Firm—Douglas L. Weller

[57] ABSTRACT

An insulated gate field effect transistor with an extended drain region is presented. The extended drain region includes a single-sided JFET and a double-sided JFET connected in parallel. The insulated gate field effect transistor is built on a substrate of first conductivity type. A pocket of semiconductor material of second conductivity type is within the substrate adjoining a surface of the substrate. A body region of semiconductor material of the first conductivity type is within the pocket adjoining the surface of the substrate. Also, a source region of semiconductor material of the second conductivity type is within the body region adjoining the surface of the substrate. A drain contact region of semiconductor material of the second conductivity type is also within the pocket of semiconductor material adjoining the surface of the substrate. A first intermediate region of semiconductor material of the first conductivity type is within the pocket of semiconductor material between the body region and the drain contact region. The first intermediate region adjoins the surface of the substrate. Also, a second intermediate region of semiconductor material of second conductivity type is within the pocket of semiconductor material between the body region and the drain contact region. The second intermediate region also adjoins the surface of the substrate. A portion of the second intermediate region extends between the first intermediate region and the surface of the substrate.

22 Claims, 5 Drawing Sheets

DEVICE WHICH FUNCTIONS AS A LATERAL DOUBLE-DIFFUSED INSULATED GATE FIELD EFFECT TRANSISTOR OR AS A BIPOLAR TRANSISTOR

BACKGROUND

The present invention concerns a lateral double-diffused insulated gate field effect transistor where the extended drain region is a parallel combination of a single-sided junction field effect transistor (JFET) and a double-sided JFET. The present invention also relates to the construction of a bipolar transistor with an extended collector region. The present invention additionally relates generally to how metal-oxide-silicon (MOS) and/or a bipolar transistors can be effectively shielded from a substrate in a classic junction isolated technology.

Thin layer (resurfed) lateral double diffused metal oxide silicon (D-MOS) transistors have been shown to be an efficient means to integrate high voltage devices in the same die as low voltage control functions. See, for example, Sel Colak *Effects of Drift Region Parameters on the Static Properties of Power LDMOS*, IEE Transactions on Electron Devices, VOL. ED-28, No. 12, pp. 1455-1466 (December 1981). This reference describes a device which can be considered a series combination of a D-MOS transistor and a single-sided JFET. The single-sided JFET functions as a pinch resistor. The JFET is commonly a thin n-type epitaxial layer deposited on top of a p-type substrate.

In order to improve thin layer lateral D-MOS transistors as a source follower and further reduce resistance when the device is "on", a surface layer of p-type doping has been added. The modified device can be considered a D-MOS transistor in series with a double-sided JFET. See for example, A. W. Ludikhuize, *High-Voltage DMOS and PMOS in Analog IC's*, IEDM, pp. 81-84 (1982).

An efficient and simplistic way to incorporate a thin layer lateral high voltage MOS transistor which constitutes a series combination of a normal MOS transistor (not D-MOS) and a double-sided JFET is described in U.S. Pat. No. 4,811,075 issued to Klas H. Eklund for *High Voltage MOS Transistors*.

In another proposed device in the prior art, a thin layer lateral D-MOS transistor is in series with a single-sided JFET and with a parallel arrangement of a single-sided JFET and a double-sided JFET. This device utilizes three epitaxial layer to improve the device as a source follower. See U.S. Pat. No. 4,626,879 issued to Sel Colak for *Lateral Double-Diffused MOS Transistor Devices Suitable for Source-Follower Applications.*

For these and similar devices, it is very often necessary to provide some shielding in order to allow operation in high voltage applications.

SUMMARY OF THE INVENTION

In accordance with the preferred embodiment of the present invention, an insulated gate field effect transistor with an extended drain region is presented. The extended drain region includes a single-sided JFET and a double-sided JFET connected in parallel.

The insulated gate field effect transistor is built on a substrate of first conductivity type. A pocket (also called a well) of semiconductor material or second conductivity type is within the substrate adjoining a surface of the substrate. A body region of semiconductor material of the first conductivity type is within the pocket adjoining the surface of the substrate. Also, a source region of semiconductor material of the second conductivity type is within the body region adjoining the surface of the substrate. A drain contact region of semiconductor material of the second conductivity type is also within the pocket of semiconductor material adjoining the surface of the substrate.

A first intermediate region of semiconductor material of the first conductivity type is within the pocket of semiconductor material between the body region and the drain contact region. The first intermediate region adjoins the surface of the substrate. Also, a second intermediate region of semiconductor material of second conductivity type is within the pocket of semiconductor material between the body region and the drain contact region. The second intermediate region also adjoins the surface of the substrate. A portion of the second intermediate region extends between the first intermediate region and the surface of the substrate.

Alternately, the transistor may be regarded as a bipolar transistor with an extended collector region. The source region functions as an emitter, and the body region functions as a base.

In an alternate embodiment for high voltage devices, the pocket of semiconductor material of the second conductivity type is replaced by an epitaxial layer of the second conductivity type. Various isolation regions of the first conductivity type within the epitaxial layer are used as shielding to isolate each transistor pair from other devices on an integrated circuit.

For example, in a preferred embodiment, the shielding includes an isolation region of the first conductivity type diffused into the epitaxial layer. Surrounding the transistor pair is a first isolation region which extends from the surface of the epitaxial layer to the isolation layer. The first isolation region is of the first conductivity type. A buried layer of the second conductivity layer is placed below the first isolation layer. A second isolation regions surrounds the first isolation region. The second isolation region extends from the surface of the epitaxial layer to the buried layer. The second isolation region is of the second conductivity type. An epitaxial region surrounds the second isolation region. The epitaxial region extends from the surface of the epitaxial layer to a depth below the second isolation region. A third isolation region surrounds the epitaxial region. The third isolation region is of the first conductivity type and extends from the surface of the epitaxial layer to the substrate.

The present invention allows for significant reduction of "on" resistance while simplifying the manufacturing process over prior art circuits. For example, at low voltages (e.g., less than 100 volts), the present invention allows for "on" resistance which is reduced two to three times over the device disclosed by Colak. The additional shielding described in the preferred embodiments facilitates use of the present invention in high voltage applications.

DESCRIPTION OF THE PREFERRED EMBODIMENT

Figure 1:
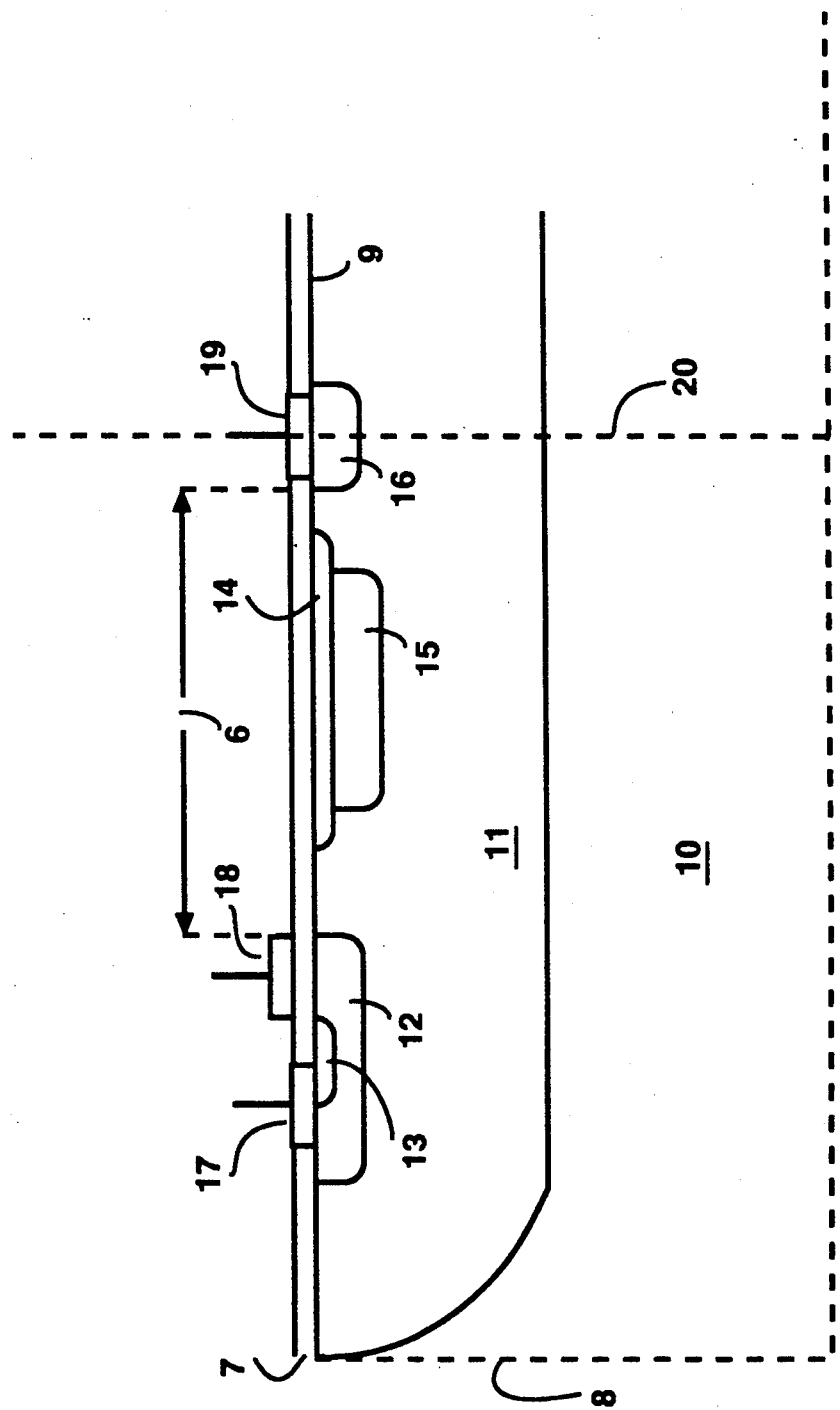
FIG. 1 is a diagrammatic view of a lateral D-MOS/-bipolar transistor in accordance with the preferred embodiment of the present invention.

FIG. 1 shows a cross-sectional view of a lateral double-diffused insulated gate field effect transistor with an extended drain region which is a parallel combination of a single-sided JFET and a double-sided JFET formed on a semiconductor die 8.

A substrate 10 of first conductivity type is, for example, made of p⁻-type material doped with $5 \times 10^{14}$ atoms per cubic centimeter. A typical depth of substrate 10 is 500 microns. A pocket 11 of material of second conductivity type is, for example, n-type material doped at $3 \times 10^{12}$ atoms per square centimeter. Pocket 11 extends a depth of, for example, 5 microns below a surface 9 of die 8. The doping levels and dimensions given here and below are for a device with a breakdown voltage of approximately 300 volts.

Within pocket 11 a body region 12 of first conductivity type is, for example, p-type material doped at between $10^{17}$ and $10^{20}$ atoms per cubic centimeter. Body region 12 typically extends a depth of 1 micron below surface 9 of die 8. Within body region 12, a source region 13 of second conductivity type is, for example, n⁺-type material doped at between $10^{18}$ and $10^{20}$ atoms per cubic centimeter. Source region 13, for example, extends 0.4 microns below surface 9 of die 8. Body region 12 may be electrically connected directly to substrate 10 by extending body region 12 outside pocket region 11.

A drain contact region 16 of second conductivity type is, for example, n⁺-type material doped at between $10^{18}$ and $10^{20}$ atoms per cubic centimeter. Drain contact region 16, for example, extends 0.4 microns below surface 9 of die 8. A source contact 17 is placed on surface 9 in electrical contact with body region 12 and a source contact region portion of source region 13. A drain contact 19 is placed on surface 9 in electrical contact with drain contact region 16. An insulating layer 7 is placed on surface 9 of die 8. A gate contact 18 is placed on insulating layer 7 over a channel region portion of body region 12, as shown.

Between body region 12 and region 16 is a region 14 of second conductivity type. Region 14 is, for example n-type material doped at $2 \times 10^{12}$ atoms per square centimeter. Region 14 extends downward from surface 9 to a depth of, for example 0.4 microns. Located below region 14 is a region 15 of first conductivity type. Region 15 is, for example, p-type material doped at $4 \times 10^{12}$ atoms per square centimeter. Region 15 extends from surface 9 downward a depth of, for example 1 micron. Region 15 is connected to ground at surface 9 in a plane not shown in FIG. 1. A distance 6 between and edge of body region 12 and an edge of drain contact 16 is, for example 12 microns. A symmetry line 20 is used for placing a second half of the transistor in a mirror image to the first half shown in FIG. 1.

The circuit shown in FIG. 1, may also function as a bipolar transistor with region 13 functioning as an emitter, region 12 functioning as a base, and pocket 11, region 14 and region 16 functioning as an extended collector.

Figure 2:
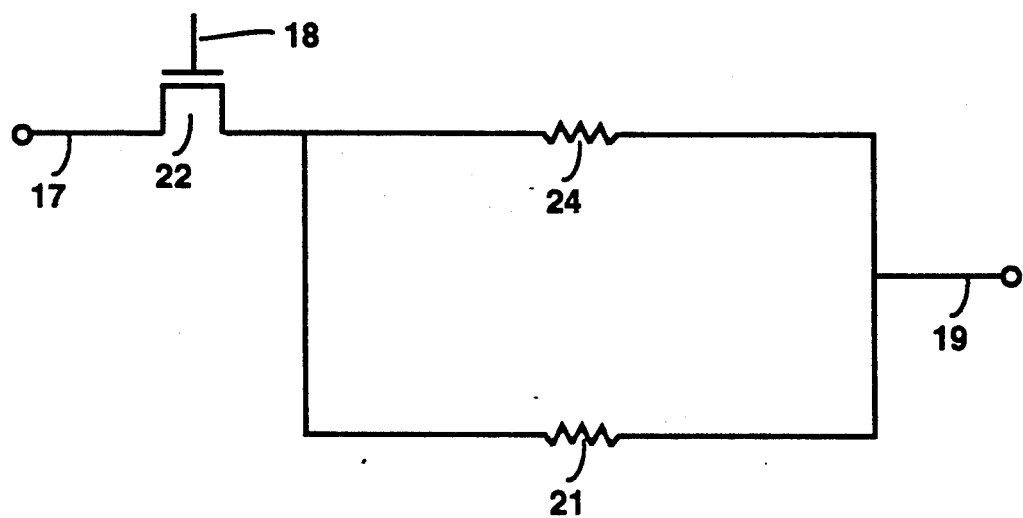
FIG. 2 is a schematic of the lateral D-MOS/bipolar transistor shown in FIG. 1 in accordance with the preferred embodiment of the present invention.

FIG. 2 shows a circuit diagram for the lateral double-diffused insulated gate field effect transistor with an extended drain region which is a parallel combination of a single-sided JFET and a double-sided JFET shown in FIG. 1. A transistor 22 is controlled by gate contact 18. Current through transistor 22 travels from source contact 17 through region 13 through body region 12 to region 11, shown in FIG. 1.

The extends drain region of transistor 22 includes a single-sided JFET 24 and a double-sided JFET 21 connected in parallel as shown. Current through single-sided JFET 24 passes through region 14 and through region 16 to drain contact 19. Region 15 serves as the single side of single-sided JFET 24. Current through double-sided JFET 21 passes through region 11 and through region 16 to drain contact 19. Region 15 and substrate 10 serve as the two sides of double-sided JFET 21.

The above-discussed design allows for significant reduction of resistance from source contact 17 to drain contact 19 when transistor 22 is "on", over circuits in the prior art. The present invention is also simpler to manufacture than related prior art devices.

Figure 3:
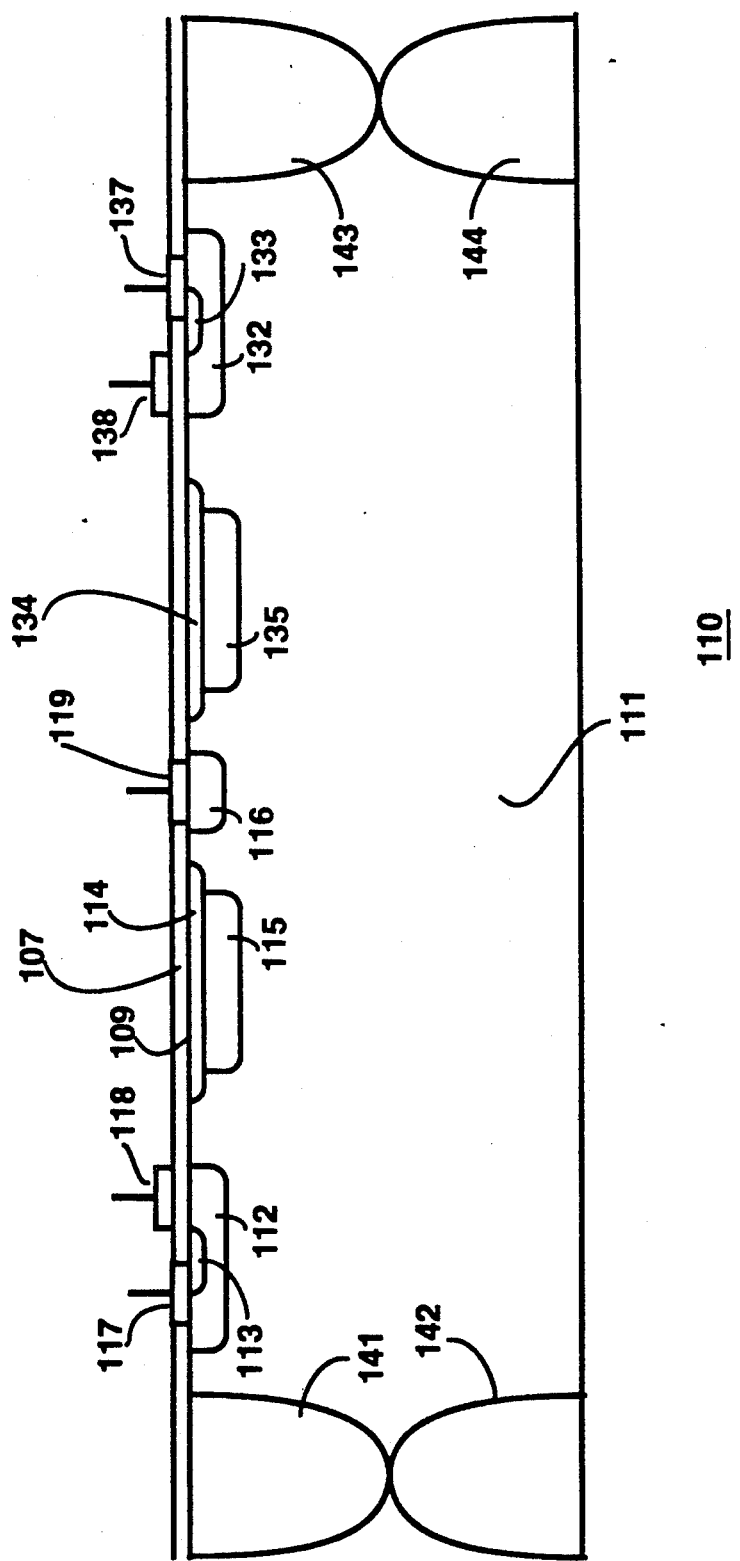
FIG. 3 is a diagrammatic view of a lateral D-MOS/-bipolar transistor in accordance with an alternate preferred embodiment of the present invention for high voltage devices.

FIG. 3 shows a cross-sectional view of a lateral double-diffused insulated gate field effect transistor with extended drain region in accordance with an alternate preferred embodiment of the present invention. The transistor shown in FIG. 3 is surrounded by isolation diffusion which is necessary in order to isolate the transistor from other devices on an integrated circuit.

A substrate 110 of first conductivity type is, for example, made of p⁻-type material doped with $5 \times 10^{14}$ atoms per cubic centimeter. A typical depth of substrate 110 is 500 microns. A layer 111 of material of second conductivity type is, for example, n-type epitaxial material doped at $10^{15}$ atoms per cubic centimeter. Layer 111 extends a depth of, for example, 10 to 25 microns below a surface 109.

For a first half of the transistor, a body region 112 of first conductivity type is, for example, p-type material doped at between $10^{17}$ and $10^{20}$ atoms per cubic centimeter. Body region 112 typically extends a depth of 1 micron below surface 109. Within body region 112, a source region 113 of second conductivity type is, for example, n⁺-type material doped at between $10^{18}$ and $10^{20}$ atoms per cubic centimeter. Source region 113, for example, extends 0.4 microns below surface 109.

A drain contact region 116 of second conductivity type is, for example, n⁺-type material doped at between $10^{18}$ and $10^{20}$ atoms per cubic centimeter. Drain contact region 116, for example, extends 0.4 microns below surface 109.

A source contact 117 is placed on surface 109 in electrical contact with body region 112 and a source contact region portion of source region 113. A drain contact 119 is placed on surface 109 in electrical contact with drain contact region 116. An insulating layer 107 is placed on surface 109. A gate contact 118 is placed on insulating layer 107 over a channel region portion of body region 112, as shown.

Between body region 112 and region 116 is a region 114 of second conductivity type. Region 114 is, for example, n-type material doped at $2 \times 10^{12}$ atoms per square centimeter. Region 114 extends downward from surface 109 to a depth of, for example 0.4 microns. Located below region 114 is a region 115 of first conductivity type. Region 115 is, for example, p-type material doped at $4 \times 10^{12}$ atoms per square centimeter. Region 115 extends from surface 109 downward a depth of, for example 1 micron. Region 115 is connected to ground at surface 109 in a plane not shown in FIG. 1.

A second half of the transistor is a mirror image of the first half of the transistor with symmetry around drain contact region 116. For the second half of the transistor, a body region 132 of first conductivity type is, for example, p-type material. Within body region 132, a source region 133 of second conductivity type is, for example, n+-type material.

A source contact 137 is placed on surface 109 adjacent to body region 132 and in electrical contact with source region 133. A gate contact 138 is placed on insulating layer 107 over a channel region portion of body region 132, as shown.

Between a body region 132 and region 116 is a region 134 of second conductivity type. Region 134 is, for example, n-type material. Located below region 134 is a region 135 of first conductivity type. Region 135 is connected to ground at surface 109 in a plane not shown in FIG. 3.

The transistor shown in FIG. 3, may also function as a bipolar transistor with region 113 and region 133 functioning as an emitter, region 112 and region 132 functioning as a base, and layer 111, region 114, region 134 and region 116 functioning as an extended collector.

An isolation region 141, an isolation region 142, an isolation region 143 and an isolation region 144, each of first conductivity type, provide isolation for the transistor from other devices. Isolation regions 141 through are, for example, of p-type material doped at between $10^{16}$ and $10^{19}$ atoms per cubic centimeter. Isolation region 141 and isolation region 143 are diffused down while isolation region 142 and isolation region 144 are diffused up.

When a device is either embedded in a well or an epitaxial layer, a severe problem can arise when the diode formed by the body region and the well (or epitaxial layer) is forward biased and the diode formed by the well region and the substrate is backed biased at a high negative voltage (e.g., less than $-50$ volts). Specifically, this can trigger a parasitic bipolar transistor where the body region will act as an emitter, the well (or epitaxial layer) will act as base and the substrate will act as a collector. The gain of such a parasitic bipolar transistor is typically more than 100; therefore, practically all the current will flow to the substrate creating a parasitic power dissipation through the substrate. To solve this issue, a layer of semiconductor material of opposite conductivity type from the conductivity type of the substrate may be buried under the well (or epitaxial layer) to drastically reduce the gain of the parasitic bipolar transistor. In many cases even this scheme does not result in sufficient isolation for optimal performance. In such cases, the isolation scheme shown in FIG. 4 may be utilized.

Figure 4:
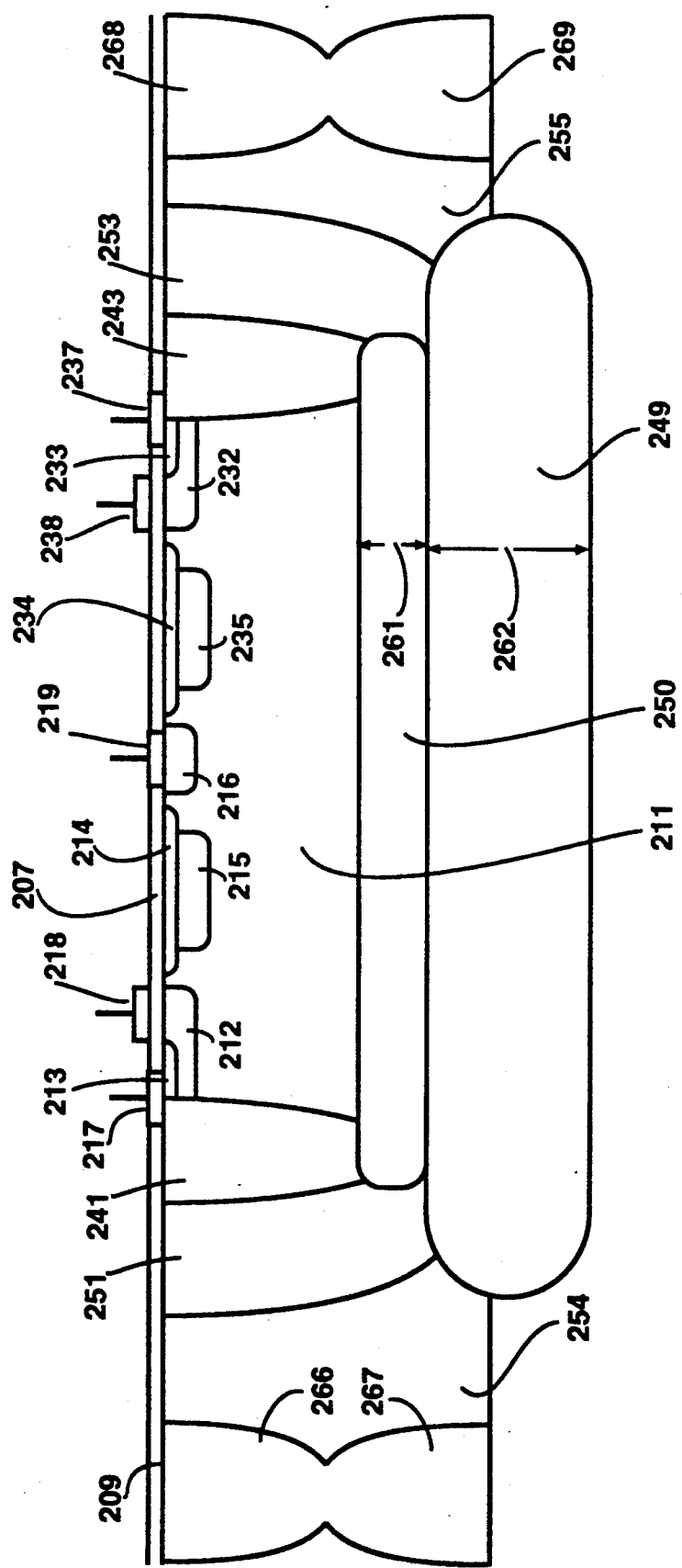
FIG. 4 is a diagrammatic view of a lateral D-MOS/-bipolar transistor in accordance with another alternate preferred embodiment of the present invention for high voltage devices.

FIG. 4 shows a cross-sectional view of two lateral double-diffused insulated gate field effect transistors with extended drain regions where the transistors are additionally shielded from the substrate and other devices.

A substrate 210 of first conductivity type is, for example, made of p⁻-type material doped with $5 \times 10^{14}$ atoms per cubic centimeter. A typical depth of substrate 210 is 500 microns. A layer 21 of material of second conductivity type is, for example, n-type epitaxial material doped at $10^{15}$ atoms per cubic centimeter. Layer 211 extends a depth of, for example, 12 to 17 microns below a surface 209.

For a first half of the transistor, a body region 212 of first conductivity type is, for example, p-type material doped at between $10^{17}$ and $10^{20}$ atoms per square centimeter. Body region 212 typically extends a depth of 1 micron below surface 209. Within body region 212, a source region 213 of second conductivity type is, for example, n+-type material doped at between $10^{18}$ and $10^{20}$ atoms per cubic centimeter. Source region 213, for example, extends 0.4 microns below surface 209.

A drain contact region 216 of second conductivity type is, for example, n+-type material doped at between $10^{18}$ and $10^{20}$ atoms per cubic centimeter. Drain contact region 216, for example, extends 0.4 microns below surface 209.

A source contact 217 is placed on surface 209 in electrical contact with body region 212 and a source contact region portion portion of source region 213. A drain contact 219 is placed on surface 209 in electrical contact with drain contact region 216. An insulating layer 207 is placed on surface 209. A gate contact 218 is placed on insulating layer 207 over a channel region portion of body region 212, as shown.

Between body region 212 and region 216 is a region 214 of second conductivity type. Region 214 is, for example, n-type material doped at $2 \times 10^{12}$ atoms per square centimeter. Region 214 extends downward from surface 209 to a depth of, for example 0.4 microns. Located below region 214 is a region 215 of first conductivity type. Region 215 is, for example, p-type material doped at $4 \times 10^{12}$ atoms per square centimeter. Region 215 extends from surface 209 downward a depth of, for example 1 micron. Region 215 is connected to ground at surface 209 in a plane not shown in FIG. 1.

A second half of the transistor is a mirror image of the first half of the transistor with symmetry around drain contact region 216. For the second half of the transistor, a body region 232 of first conductivity type is, for example, p-type material. Within body region 232, a source region 232, a source region 233 of second conductivity type is, for example, n+-type material.

A source contact 237 is placed on surface 209 adjacent to body region 232 and in electrical contact with source region 233. A gate contact 238 is placed on insulating layer 207 over a channel region portion of body region 232, as shown.

Between body region 232 and region 216 is a region 234 of second conductivity type. Region 234 is, for example, n-type material. Located below region 234 is a region 235 of first conductivity type. Region 235 is connected to ground at surface 209 in a plane not shown in FIG. 4.

The transistor shown in FIG. 4, may also function as a bipolar transistor with region 213 and region 233 functioning as an emitter, region 212 and region 232 functioning as a base, and layer 211, region 214, region 234 and region 216 functioning as an extended collector.

Isolation layers and isolation regions isolate the transistor from the substrate and from other devices. Surrounding the transistor shown in FIG. 4 is an isolation region 241, an isolation region 243 and an isolation region 250. Additionally, an isolation region 266 and an isolation region 267 are adjacent to a region 254 of epitaxial material of the second conductivity type. An isolation region 268 and an isolation region 269 are adjacent to a region 255 of epitaxial material of the second conductivity type. Additionally a sinker region 251 and a sinker region 253 are located as shown.

Isolation region 241, isolation region 243, isolation region 250, isolation region 266, isolation region 267, isolation region 268 and isolation region 269 are each of first conductivity type, for example, p-type material doped at between $10^{16}$ and $10^{20}$ atoms per cubic centimeter. Sinker region 251 and sinker region 253 are, for example of n+-type material doped at between $10^{18}$ and $10^{20}$ atoms per cubic centimeter. Region 254 and region 255 are, for example, of n-type epitaxial material doped at $10^{15}$ atoms per cubic centimeter.

In addition to Isolation region 250, a buried layer 249 of second conductivity type is placed to provide further isolation of the transistor from substrate 210. Buried layer 249 consists of, for example, n+-type semiconductor material doped at between $10^{17}$ and $10^{19}$ atoms per cubic centimeter. Region 250 has a depth 261 of, for example, three microns. Buried layer 249 has a depth 262 of, for example, ten microns. Region 250 and buried layer 249 combine to effectively isolate substrate 210 from the transistor device even at high voltages.

Figure 5:
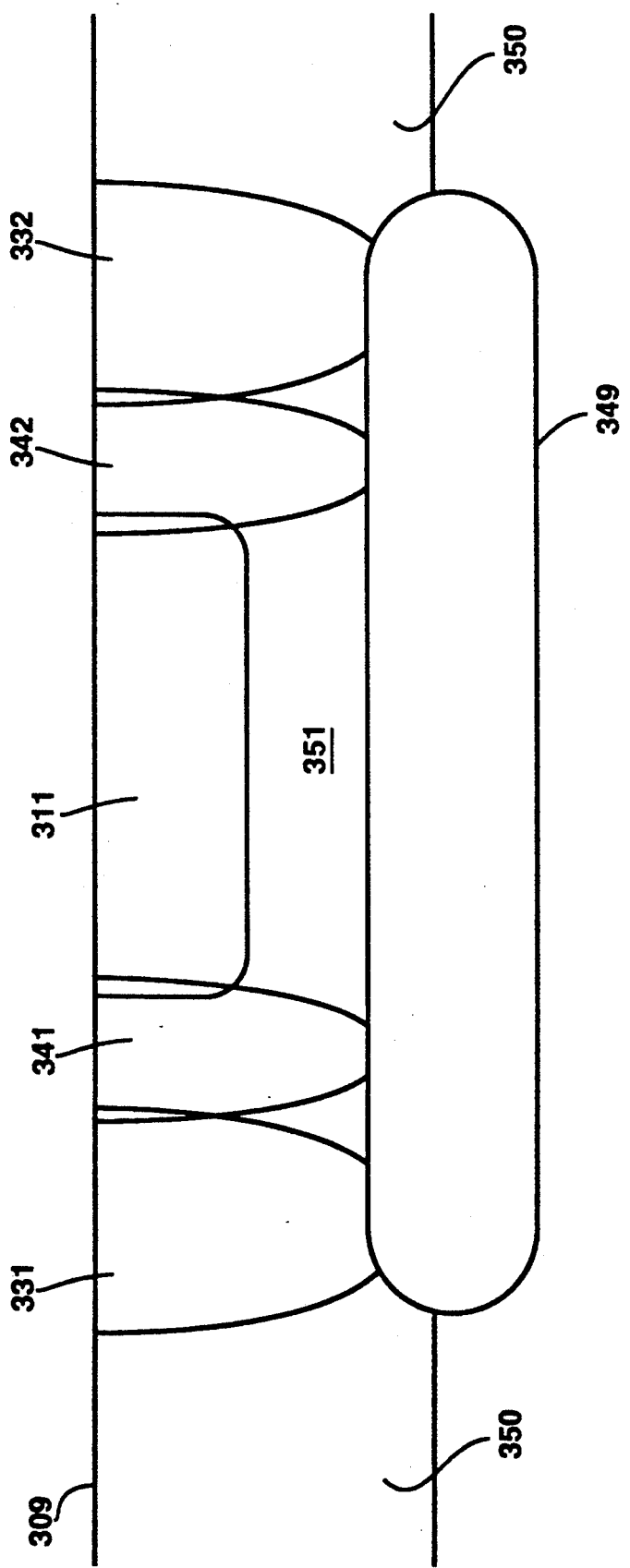
FIG. 5 shows an alternate shielding embodiment for the lateral D-MOS/bipolar transistors shown in FIGS. 1 through 4 in accordance with a preferred embodiment of the present invention.

FIG. 5 shows another shielding arrangement which isolates devices used in high voltage applications. A substrate 310 of first conductivity type is, for example, made of p--type material doped with $5 \times 10^{14}$ atoms per cubic centimeter. A typical depth of substrate 210 is 500 microns. A layer 350 of material of first conductivity type is, for example, p-type epitaxial material doped at between $5 \times 10^{15}$ and $5 \times 10^{16}$ atoms per cubic centimeter. Layer 350 extends a depth of, for example, 10 to 25 microns below a surface 309.

Active devices are placed within a well 311 of second conductivity type. Well 311 is, for example, n-type material doped at $5 \times 10^{15}$ and $5 \times 10^{16}$ atoms per cubic centimeter. Well 311 extends a depth of, for example, 5 microns below a surface 309.

Isolation layers and isolation regions isolate a device within well 311 from substrate 310 and from other devices. Immediately below well 311 is a region 351 which is in part of layer 350. Surrounding well 311 and region 351 is an isolation region 341, and an isolation region 342. Surrounding isolation region 341 and isolation region 342 are a sinker region 331 and a sinker region 332.

Isolation region 341 and isolation region 342 are each of first conductivity type, for example, p+-type material doped at between $10^{17}$ and $10^{19}$ atoms per cubic centimeter. Sinker region 331 and sinker region 332 are, for example of n+-type material doped at between $10^{17}$ and $10^{19}$ atoms per cubic centimeter.

A buried layer 349 of second conductivity type is placed to provide isolation of the device in well 311 from substrate 310. Buried layer 349 consists of, for example, n+-type semiconductor material doped at between $10^{17}$ and $10^{19}$ atoms per cubic centimeter. Buried layer 349 has a depth of, for example, ten microns. Region 351 and buried layer 349 combine to effectively isolate substrate 310 from the device in well 311 even at high voltages greater than 50 volts.

The foregoing discussion discloses and describes merely exemplary methods and embodiments of the present invention. For example, in the above discussion the first conductivity type is n-type material and the second conductivity type is p-type material. Alternately, the first conductivity type could be p-type material and the second conductivity type could be n-type material. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A semiconductor device comprising:
   a substrate of first conductivity type;
   a pocket of semiconductor material of second conductivity type which adjoins a surface of the substrate;
   a body region of semiconductor material of the first conductivity type which is within the pocket of semiconductor material and which adjoins the surface of the substrate;
   a source region of semiconductor material of the second conductivity type, the source region being within the body region and adjoining the surface of the substrate;
   a drain contact region of semiconductor material of the second conductivity type within the pocket of semiconductor material which adjoins the surface of the substrate;
   a first intermediate region of semiconductor material of the first conductivity type which adjoins the surface of the substrate and which is located within the pocket of semiconductor material between the body region and the drain contact region; and,
   a second intermediate region of semiconductor material of the second conductivity type which adjoins the surface of the substrate and which is located within the pocket of semiconductor material between the body region and the drain contact region, wherein a portion of the second intermediate region extends between the first intermediate region and the surface of the substrate.

2. A semiconductor device as in claim 1 wherein the substrate is electrically coupled to the body region by extending a portion of the body region out of the pocket of semiconductor material.

3. A semiconductor device as in claim 1 wherein the semiconductor device is a lateral double-diffused insulated gate field effect transistor with an extended drain region.

4. A semiconductor device as in claim 1 wherein the semiconductor device is a bipolar transistor, the source region functioning as an emitter, and the body region functioning as a base.

5. A semiconductor device comprising:
   a drain contact;
   a single-sided JFET having a first end electrically coupled to the drain contact and having a second end;
   a double-sided JFET having a first end electrically coupled to the first end of the single-sided JFET and having a second end electrically coupled to the second end of the single-sided JFET;
   a source contact;
   a gate contact;

an insulated field effect transistor having a gate region coupled to the gate contact, having a source region electrically coupled to the source contact, and having a drain region electrically coupled to the second end of the single-sided JFET and to the second end of the double-sided JFET.

6. A semiconductor device as in claim 5 wherein the double-sided JFET comprises:
a first semiconductive path within a pocket of semiconductor material of second conductivity type, the pocket of semiconductor material being within a substrate of first conductivity type, wherein a first region of semiconductor material of first conductivity type is placed between the first semiconductive path and a surface of the substrate.

7. A semiconductor device as in claim 6 wherein the single-sided JFET comprises:
a second semiconductive path composed of a semiconductor material of second conductivity type; the second semiconductive path residing between the first region of semiconductor material and the surface of the substrate.

8. A semiconductor device as in claim 7 wherein the insulated gate field effect transistor comprises:
a body region of semiconductor material of the first conductivity type, the body region being within the pocket of semiconductor material wherein the body region adjoins the surface of the substrate and is separated from the gate contact by a layer of insulator placed on the surface of the substrate; and,
a source region of semiconductor material of the second conductivity type, the source region being within the body region and the source region being electrically coupled to the source contact.

9. A semiconductor device as in claim 5 wherein the double-sided JFET comprises:
a first semiconductive path within a layer of epitaxial material of second conductivity type, the layer of epitaxial material being deposited on a substrate of first conductivity type, wherein a first region of semiconductor material of first conductivity type is placed between the first semiconductive path and a surface of the layer of epitaxial material.

10. A semiconductor device as in claim 9 wherein the single-sided JFET comprises:
a second semiconductive path composed of semiconductor material of second conductivity type; the second semiconductive path residing between the first region of semiconductor material and the surface of the layer of epitaxial material.

11. A semiconductor device as in claim 10 wherein the insulated gate field effect transistor comprises:
a body region of semiconductor material of the first conductivity type, the body region being within the layer of epitaxial material wherein the body region adjoins the surface of the layer of epitaxial material and is separated from the gate contact by a layer of insulator placed on the surface of the layer of epitaxial material; and,
a source region of semiconductor material of the second conductivity type, the source region being within the body region and the source region being electrically coupled to the source contact.

12. A semiconductor device comprising:
a substrate of first conductivity type;
a layer of epitaxial material of second conductivity type deposited on a surface of the substrate;

a body region of semiconductor material of the first conductivity type which is within the layer of epitaxial material and which adjoins the surface of the layer of epitaxial material;
a source region of semiconductor material of the second conductivity type, the source region being within the body region and adjoining the surface of the layer of epitaxial material;
a drain contact region of semiconductor material of the second conductivity type within the layer of epitaxial material which adjoins the surface of the layer of epitaxial material;
a first intermediate region of semiconductor material of the first conductivity type which adjoins the surface of the layer of epitaxial material and which is located within the layer of epitaxial material between the body region and the drain contact region; and,
a second intermediate region of semiconductor material of the second conductivity type which adjoins the surface of the layer of epitaxial material and which is located within the layer of epitaxial material between the body region and the drain contact region, wherein a portion of the second intermediate region extends between the first intermediate region and the surface of the layer of epitaxial material.

13. A semiconductor device as in claim 12 wherein the semiconductor device is isolated from other semiconductor devices within the substrate by isolation layers of the first conductivity type within the layer of epitaxial material.

14. A semiconductor device as in claim 13 wherein the semiconductor device is isolated from the substrate by a first isolation layer of the first conductivity type diffused within the layer of epitaxial material and by a buried layer of the second conductivity type diffused within the layer of epitaxial material and below the first isolation layer.

15. A semiconductor device as in claim 12 wherein the semiconductor device is a lateral double-diffused insulated gate field effect transistor with an extended drain region.

16. A semiconductor device as in claim 12 wherein the semiconductor device is a bipolar transistor, the source region functioning as an emitter, and the body region functioning as a base.

17. A semiconductor device comprising:
a substrate of first conductivity type;
a layer of epitaxial material of second conductivity type deposited on a surface of the substrate;
a body region of semiconductor material of the first conductivity type which is within the layer of epitaxial material and which adjoins the surface of the layer of epitaxial material;
a source region of semiconductor material of the second conductivity type, the source region being within the body region and adjoining the surface of the layer of epitaxial material;
a drain contact region of semiconductor material of the second conductivity type within the layer of epitaxial material which adjoins the surface of the layer of epitaxial material;
a first isolation layer of the first conductivity type diffused in the layer of epitaxial material; and,
a buried layer of the second conductivity type diffused in the layer of epitaxial material and below the first isolation layer.

18. A semiconductor device as in claim 17 additionally comprising:
  a first intermediate region of semiconductor material of the first conductivity type which adjoins the surface of the layer of epitaxial material and which is located within the layer of epitaxial material between the body region and the drain contact region; and,
  a second intermediate region of semiconductor material of the second conductivity type which adjoins the surface of the layer of epitaxial material and which is located within the layer of epitaxial material between the body region and the drain contact region, wherein a portion of the second intermediate region extends between the first intermediate region and the surface of the layer of epitaxial material.

19. Shielding for a high power semiconductor device, the high power semiconductor device being placed in a layer of epitaxial material of second conductivity type deposited on a surface of a substrate of first conductivity type, the shielding comprising:
  an isolation layer of the first conductivity type diffused in the layer of epitaxial material;
  a first isolation region within the layer of epitaxial material and surrounding the high power semiconductor device, the first isolation region extending from the surface of the layer of epitaxial material to the isolation layer and the first isolation region being of the first conductivity type;
  a buried layer of the second conductivity type diffused into the layer of epitaxial material and below the isolation layer;
  a second isolation region surrounding the first isolation region, the second isolation region extending from the surface of the layer of epitaxial material to the buried layer and the second isolation region being of the second conductivity type;
  an epitaxial region surrounding the second isolation region, the epitaxial region extending from the surface of the layer of epitaxial material to a depth below the second isolation region; and,
  a third isolation region surrounding the epitaxial region, the third isolation region extending from the surface of the layer of epitaxial material and the third isolation region being of the first conductivity type.

20. A semiconductor device as in claim 17 wherein the semiconductor device is a lateral double-diffused insulated gate field effect transistor with an extended drain region.

21. A semiconductor device as in claim 17 wherein the semiconductor device is a bipolar transistor, the source region functioning as an emitter, and the body region functioning as a base.

22. A shielding for a high power semiconductor device within a layer of epitaxial material of first conductivity type deposited on a substrate of the first conductivity type, the shielding comprising:
  a well of second conductivity type which adjoins a surface of the layer of epitaxial material, the high power semiconductor device being placed in the well;
  a buried layer of the second conductivity type diffused into the layer of epitaxial material;
  an isolation region of first conductivity type, within the layer of epitaxial material located above the buried layer and surrounding the well; and,
  a sinker region of second conductivity type, placed above the buried layer and surrounding the isolation type.

* * * * *